Nov. 29, 1960 C. G. DE BLASIO 2,962,672

DUAL-TUBE MODULATOR AND ASSOCIATED FREQUENCY-MODULATED CRYSTAL OSCILLATOR CIRCUIT THEREFOR

Filed Nov. 28, 1955 2 Sheets-Sheet 1

INVENTOR.
Conrad G. De Blasio

BY Harold D. Gregory

ATTORNEY

Frequency deviation diagram for one reactance tube, 18 or 19

Frequency deviation diagram for both reactance tubes, 18 and 19

INVENTOR.
Conrad G. DeBlasio
BY
Harold E. Gregory
ATTORNEY

United States Patent Office 2,962,672

Patented Nov. 29, 1960

2,962,672

DUAL-TUBE MODULATOR AND ASSOCIATED FREQUENCY-MODULATED CRYSTAL OSCILLATOR CIRCUIT THEREFOR

Conrad G. De Blasio, Middletown, N.J. (R.F.D. 1, Box 484, Red Bank, N.J.)

Filed Nov. 28, 1955, Ser. No. 549,435

4 Claims. (Cl. 332—28)

My invention relates to a dual-tube modulator and associated frequency-modulated crystal oscillator circuit therefor with provision for wide-range, linear sweep of frequency by the dual-tube arrangement and action.

Among the objects of my invention is the provision of a dual-tube, balanced-reactance modulator adapted particularly for association in a frequency-modulated oscillator circuit embodying a piezoelectric crystal, the arrangement and operating action being such as to provide for good stability and exceptional sweep and linearity.

Another object is the provision of an improved frequency-modulation circuit and method by which the frequency of a crystal-controlled oscillation generator can be varied or modulated over relatively wide frequency limits, without losing the intrinsic frequency stability of the crystal element.

Another object is the provision of an improved frequency-modulation circuit and method by which the aforesaid advantages are obtained, but without resorting to loading of the crystal or oscillator circuit.

Other objects and advantages will hereinafter appear.

Figure 3:
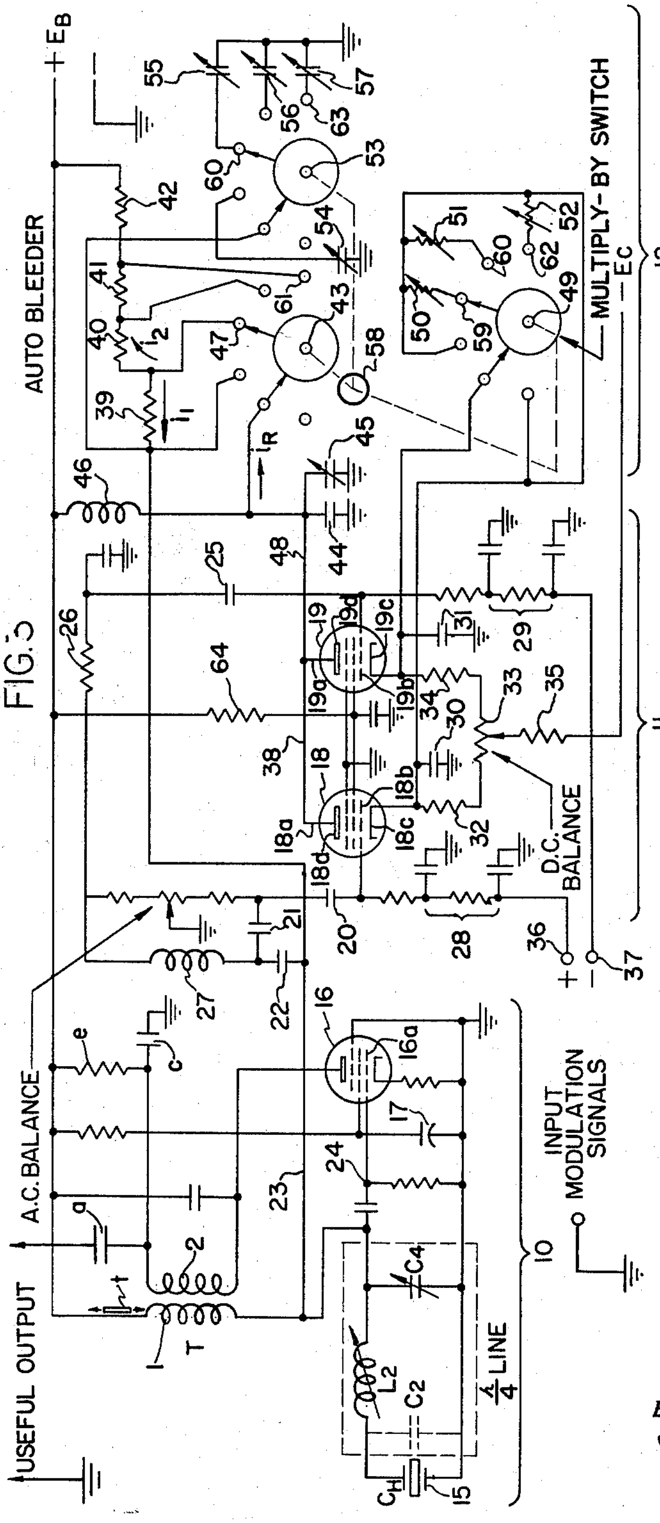
Figure 2:
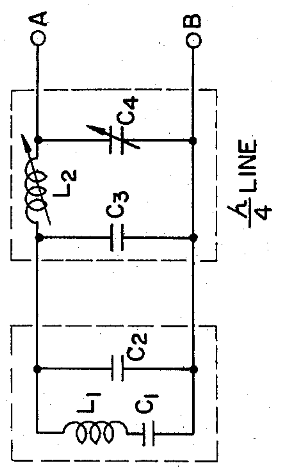
Figure 1:
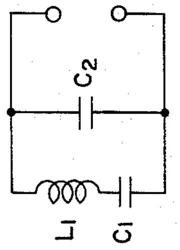
Figure 4:
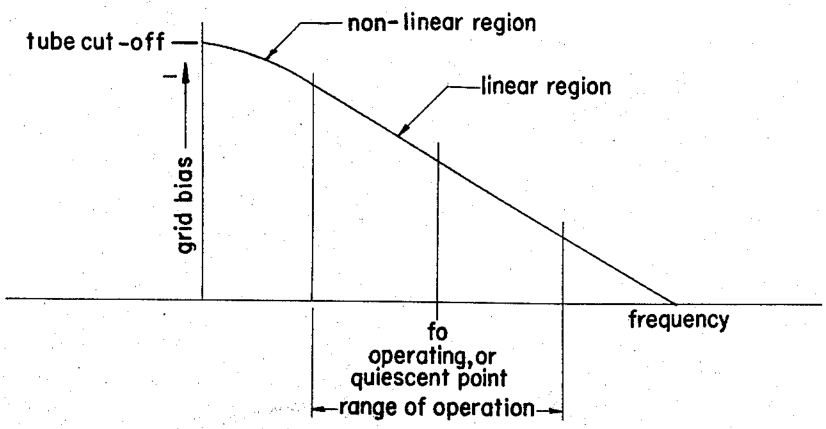
Figure 5:
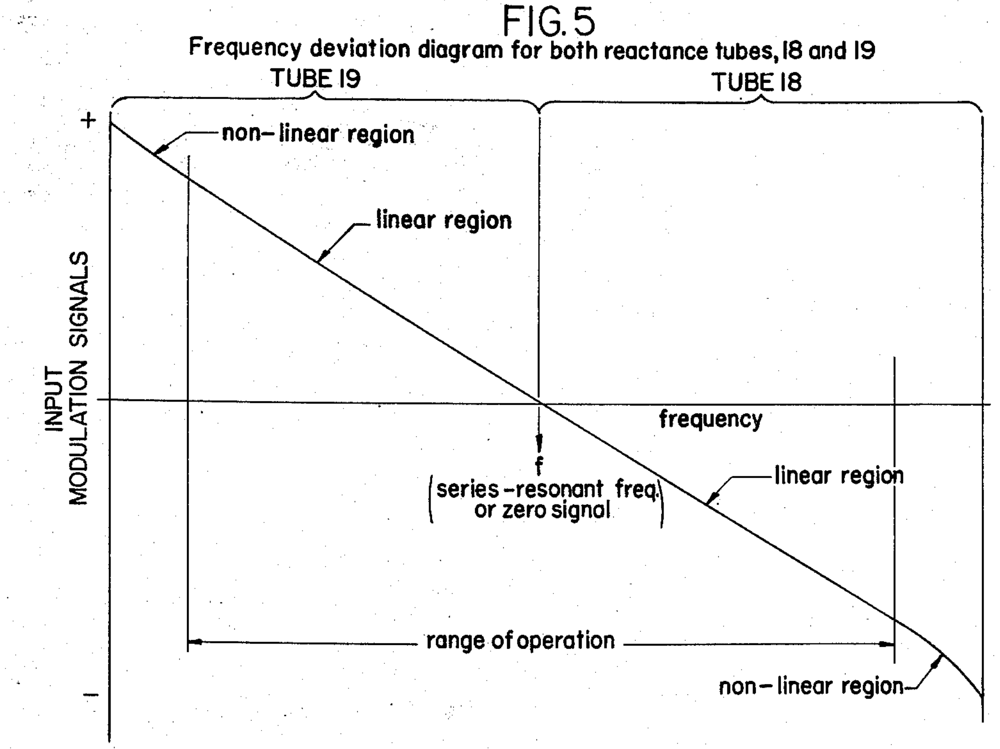

For the purpose of illustrating my invention an embodiment thereof is shown in the drawings, wherein Figs. 1 and 2 are simplified, diagrammatic views illustrative of the method or manner, in my improved circuit, of avoiding or eliminating parallel resonance attributable to capacitance between the holder and contact plates of the crystal;

Fig. 3 is a diagrammatic view of a dual-tube modulator embodying my invention and incorporated in a frequency-modulated crystal oscillator circuit also embodying features to which my invention relates; and Figs. 4 and 5 are simplified, graphical presentations illustrative of the overall frequency-shift performance in my improved dual-tube modulator.

Some examples of oscillator or modulator circuits of the prior art which have one or more of the disadvantages avoided by one or more of the novel features herein, are disclosed in Patents Nos. 2,424,246; 2,298,438; 2,531,103; 2,240,450; 2,309,083; 2,639,387; and 2,323,956. Reference might also be made to Patents Nos. 2,184,104; 2,349,811; 2,422,422; 2,422,424; 2,440,622; 2,530,165; 2,551,809; 2,552,157; 2,558,707; 2,590,753; 2,646,509; 2,683,810; 2,703,387; 2,777,992; and 2,802,069. For circuit and other details and electronic or other action well known to those skilled in the art and therefore not fully explained herein, reference is made to these and other patents and texts of the prior art.

In the various circuits proposed heretofore to employ a piezoelectric crystal for the frequency-determining element in an oscillator, it is not possible to obtain appreciable amounts of linear, controlled shift. The reason for this insufficiency is attributable to the crystal serving as the resonant element in such oscillators. This crystal is represented by the electrical circuit in Fig. 1 wherein $C_1$ and $L_1$ are the equivalent electrical constants of the crystal. $C_2$ is the holder and contact-plate capacitance. The terminal impedance of the network shown in Fig. 1 can be expressed as $$\frac{j(X_{L1}-X_{C1})X_{C2}}{X_{C1}+X_{C2}-X_{L1}}$$

This circuit or network has two reasonance frequencies, i.e., a series resonance determined by $C_1$ and $L_1$, and a parallel resonance when it is considered that $C_2$ is part of the resonant circuit. Keeping in mind the fact that the ratio of $C_2$ to $C_1$ is normally of the order of 1,000 or more, it will be observed from the above expression that the two resonant modes lie very close to each other in frequency. This expression also reveals that a variation of the shunt element $C_2$ will have no effect on the series resonance, and only slight effect on the parallel resonance.

In my improved system or circuit, for the purpose of providing access to the series-resonance elements, a lumped-constant transmission line is added to the network, as shown in Fig. 2. This line is designed to have an electrical wavelength of a quarter wave at the operating frequency. $C_3$ is made at least equal to $C_2$ for the purpose of lumping the latter with $C_3$, thereby causing $C_2$ to "vanish." Also, under the same conditions the series-resonance impedance of $C_1L_2$ will appear at terminals AB as a high impedance because of the well known properties of a quarter-wave line. Furthermore, any reactance connected to the output terminals AB will appear as a reactance of opposite sign in the crystal-resonance circuit. By this expedient, connection at AB is a direct one, to the series-resonance circuit. This makes possible a controlled deviation or alteration of the series-resonance frequency, and consequently a corresponding change or variation in the maximum impedance frequency of the total network measured across terminals AB. As this network is shown in Fig. 2, however, there is the undesirable performance characteristic which resides in the fact that at frequencies greatly removed from the initial resonance frequency of the crystal, parasitic resonances may be derived to produce a more favorable impedance at AB than for the useful frequencies. In an oscillator circuit this would lead to frequency jumping and to a loss of crystal control when operating over a broad frequency range. This tendency could be reduced by introducing elements across the crystal circuit. However, this would impair, somewhat, action of the crystal. Another difficulty or problem resides in the fact that any reactance inserted in the crystal-resonance circuit is but a small percentage of either $X_{L1}$ or $X_{C1}$, since the ratio of $L_1$ to $C_1$ is very high. Accordingly, much larger reactance sweeps are necessary to produce a given change in frequency than would be necessary in a conventional, parallel-resonant tuned circuit. It is difficult to produce such larger reactance sweeps linearly, by electronic means.

It is with the foregoing in mind that reference is now made to Fig. 3 disclosing both a dual-tube, balanced-reactance modulator embodying per se my invention, and a frequency-modulated oscillator circuit utilizing a piezoelectric crystal for the resonant element thereof and which per se has several novel features to which my invention relates. The combination and joint operation or cooperative action of the novel dual-tube modulator and the improved oscillator circuit also are important aspects of my invention. For convenient identification and purposes of terminology, the circuit in Fig. 3 is broken down into three distinct sections or parts bracketed, respectively, as a crystal-controlled oscillator 10, a modulator 11, and frequency-deviation or range-changing means 12.

The oscillator section 10 embodies a frequency-determining element in the form of a piezoelectric crystal 15, and an oscillator tube 16. Interposed between crystal 15 and tube 16 are the variable inductive reactance $L_2$ and the variable capacitive reactance or capacitor $C_4$ as in Fig. 2, to constitute a quarter-wave line which eliminates or cancels out the capacitance $C_2$ which otherwise would be present, as indicated in dashline. The crystal oscillator section 10 is unique in the sense that the lumped-constant transmission line comprised of $L_2$, $C_4$ and $C_2$ gains direct connection to the series-resonant elements $C_1$ and $L_1$ of crystal 15. The crystal-holder capacitance $C_H$ becomes part of the quarter-wave line. The capacitance $C_H$ may constitute all or some part of the line input capacitance. The inductor $L_2$ is adjusted to produce the quarter-wave condition at the carrier frequency. Oscillation is maintained by tube 16; and a coupling, pass-band transformer T is adjusted by a movable core represented at *t*, to attenuate modes of operation lying outside the useful range of operating frequencies, without resorting to loading of crystal 15. The circuit elements shown associated with oscillator tube 16 are arranged, chosen or adjusted so that oscillation occurs at a very low level to reduce thereby the previous, required magnitude of reactive modulating currents which are difficult to produce and which might, otherwise, unduly load crystal 15 or the oscillator circuit.

Transformer T is functional in several respects. The winding 1 thereof is a relatively high impedance inductor of low distributed capacitance which couples into the quarter-wave system without disturbance. The transformer winding 2 is a tuned winding which, together with winding 1, provides a broadly tuned passband system which inhibits spurious modes of oscillation which otherwise would severely restrict operating range. The transformer T, furthermore, provides phase-inversion and impedance matching as required by oscillator tube 16. The turns-ratio-adjustment promotes low-level operation which allows the modulator to work more easily. Still another function of transformer T resides in the fact that it permits use of a pickoff system comprising capacitors *a* and *c*, and resistor *e*. Such a system needs no buffer, and does not disturb the oscillator 16.

The modulator section 11 comprises or includes a pair of modulator pentode tubes 18 and 19 whose combined effects or respective operating actions add up to a balanced-reactance modulator which provides electronic sweep of frequency by a virtual change of reactance, and which achieves phase inversion and balanced modulation without resorting to electron tubes other than the two modulator tubes 18 and 19. Resistor 64 is made relatively large and aids balance, produced by the resistors hereinafter referred to, in an analogous manner.

Voltage feed for the tube or stage 18 is arranged to provide quadrature current in the anode circuit **18*a* in proper direction to effect a capacitive reactance. To this end the grid voltage at tube 16 is, through a coupling capacitor 20, a capacitor 21, and a coupling capacitor 22 applied to grid 18*b* so that the resultant voltage at 18*b* leads the original voltage at 23 by 90°. Thus, the plate current of tube 18** produces a capacitive reactance across capacitor $C_4$.

Voltage feed for the tube or stage 19 is arranged to provide quadrature current in the anode circuit **19*a* in proper direction to effect an inductive reactance. To this end the grid voltage at tube 16 is, through a coupling capacitor 25, a resistor 26, an inductive reactance 27, and capacitor 22 applied to grid 19*b* so that the resultant voltage at 19*b* lags the original voltage at 23 by 90°. Thus, the plate current of tube 19** produces an inductive reactance across capacitor $C_4$.

Input modulation signals are applied to grids **18*b* and 19*b* through suitable filters 28 and 29, respectively. Each of the cathode by-pass capacitors 30 and 31 is effective for radio frequencies, but each provides a high impedance for D.C. or audio frequencies. The cathodes 18*c* and 19*c* can therefore be considered as being coupled together for modulating currents. The capacitors 30 and 31, therefore, by-pass the respective cathodes 18*c* and 19*c* for radio frequencies but the latter are coupled for audio or modulating frequencies by resistance means in the form of a cathode-coupling network or coupling impedance comprised of resistors 32, 33 and 34 connected between cathodes 18*c* and 19*c* and series-connected with respect to each other. As shown in Fig. 3, in the coupling network for audio or modulating frequencies the resistors 32 and 34 thereof are individual respectively to the cathodes 18*c* and 19*c*, and the variable or adjustable resistor or potentiometer 33 provided with the conventional slider or equivalent moveable element shown, is connected between resistors 32 and 34. To the slider or adjustable element of resistor 33 there is connected one end of a very large resistor 35**, the other end of the latter being connected as indicated, to a suitable source of negative potential $-Ec$ which is made large for the reason hereinafter explained.

The resistive cathode impedance of an un-bypassed stage is given by the approximate expression $$r_c = \frac{1}{gm}$$

Since the coupling impedance is very large it can be ignored, which then gives a cathode of impedance $$\frac{1}{gm}$$

driving another cathode of impedance $$\frac{1}{gm}$$

From this it will be seen that half the signal voltage will appear at each of the two cathodes **18*c* and 19*c*, and inversion with respect to modulating frequencies will result. By way of the resistor 35 there is provided the negative potential $Ec$ which is made large so that this resistor can be very large whilst proper operating currents are maintained for tubes 18 and 19**. A corollary or resulting advantage is that the total current becomes substantially independent of tube characteristics since it will always remain in the vicinity of $$\frac{Ec}{R_{35}}$$

The system can be balanced by adjusting resistor 33.

Applying a plus voltage at input terminal 36 increases the grid voltage of tube 18, increasing the cathode voltage of this tube. Since the cathodes **18*c* and 19*c* are coupled as explained, the cathode voltage of tube 19 also increases to increase the grid-cathode bias of tube 19. Because of a change in transconductance, the net result is a decrease of radio-frequency plate current of tube 19 and an increase of radio-frequency plate current of tube 18. In other words, tube 18 draws more reactive plate current with a plus input on terminal 36, causing tube 19** to draw less reactive plate current due to the cathode coupling. There is then an unbalance in the reactance, producing at least twice the swing or deviation, as graphically shown by Figs. 4 and 5, than could be achieved if only one tube were used.

When a minus voltage is impressed at 36, tube 18 draws less current causing tube 19 to draw more current, because of the common resistive coupling. Similar operation takes place with plus and minus voltages at the input terminal 37.

In Fig. 4, which is a plot for a single reactance tube, i.e., 18 or 19, the range of bias gives the indicated deviation. From Fig. 5 it will be seen that by using the two tubes 18 and 19 connected for opposing reactance at RF frequencies but coupled for audio or modulating frequencies, there is at least twice the swing for the same input, and at least twice the range is obtained, with equal linearity. This graph also shows that the modulating system or section 11 is balanced and that at the series-resonant frequency, i.e., with zero signal at 36, 37; the reactances of tubes 18 and 19 cancel each other. Also shown is the fact that larger modulations are possible since with a given direction of modulation the reactance of one of the tubes 18 and 19 increases and that of the other decreases. Either direction of modulation is available by selection of one of the two grids 18*b* and 19*b*. More linear modulation results both from the increased range and from the compensating effect of the two reactance tubes 18 and 19. Large cathode degeneration provides for good stability.

When a frequency-modulation oscillator system, in the same general class as that shown in Fig. 3, is used for radio-frequency transmission purposes it becomes necessary to divide the modulation by integers to compensate for multiplication in following radio-amplifier stages. The novel arrangement and circuit of section 12 serves this purpose and has the advantage of providing an autotransformer effect for modulating reactance currents, using simple resistive elements. The anodes 18*d* and 19*d* of reactance tubes 18 and 19, which are tied together by connection 38, are tapped down on a bleeder network comprising resistive elements 39, 40, 41 and 42 which, by rotation of switch 43 can be connected in various combinations across the frequency-determining network. The reactance stages 18 and 19 are pentodes. As is well known, the anode current of a pentode is substantially unaffected by load impedance and is given approximately by $g_m e_g$ where $e_g$ is the exciting voltage for each grid. If the junction currents at the switch contact 47 are added, it is clear that $i_R = i_1 + i_2$. Also $$i_1(R_{39}+R_T)=i_2(R_{40}+R_{41}+R_{42})$$

where $R_T$ is the impedance of the frequency-determining network. In other words, the available (invariant) modulation current can be divided into a useful component, $i_1$, and a discarded component, $i_2$. The proportion is, $$\frac{i_1}{i_2}=\frac{R_{40}+R_{41}+R_{42}}{R_{39}+R_T}$$

In accordance with this proportion taps are added to the bleeder to provide the degrees of shift required.

The above simple relationship ignores reactances appearing at the reactance tube anodes 18*d* and 19*d*. Such reactances are canceled by the elements 44, 45 and 46 which together constitute a resonant circuit at the frequency of operation, and act to absorb any reactance on line 48. Thereafter, only a lossy component is effective on line 48.

It is important to adjust division precisely. This cannot be done on the "autobleeder" alone, because the adjustable elements would be excessively reactive. The desired result is accomplished by splitting the common coupling impedance for cathodes 18*c* and 19*c* into the resistive elements 32 and 34. A correct degree of audio degeneration is obtained by rotation of switch 49 to connect one of the trimmer resistors 50, 51 and 52 across the coupling impedance, or to short the latter. Such degeneration is not in effect for radio frequencies.

By means of a switch 53 the capacitors 54, 55, 56 and 57 are properly connected in the circuit, with respect to resistors 39, 40, 41 and 42 to permit elimination of small zero shifts caused by switching.

The elements 44, 45 and 46 are chosen or adjusted to be resonant at the carrier frequency, usually being very close or equal to the series-resonant frequency of crystal 15. No further change or adjustment in these elements need be made during operation.

Switches 43, 49 and 53 are geared or otherwise ganged, as indicated, for simultaneous rotation thereof by a common, single knob represented at 58. For any adjustment or sweep change made by turning knob 58, the movement of each of the three switches 43, 49 and 53 is the same in direction, degrees, and orientation. For example, and as shown, with switch 43 on contact 47 thereof, switches 49 and 53 are on the contacts 59 and 60, respectively. Similarly, with switch 43 on the contact 61 thereof, switches 49 and 53 are on the contacts 62 and 63, respectively. In each of the other positions of knob 58 the three switches 43, 49 and 53 are in the respective positions thereof for correct coordination of resistors 39, 40, 41 and 42; trimmers 50, 51 and 52; and capacitors 54, 55, 56 and 57.

From the foregoing it will be seen that by turning the single knob 58, different portions of the output or plate currents of reactance tubes 18 and 19 are tapped off. The values of resistors 39, 40, 41 and 42 are related so that in the different positions of switch 43 the reactance swing is divided by integral multiples. These multiples are adjusted exactly by the vernier or trimmer resistors 50, 51 and 52 which adjust degeneration, and effect an increase in the cathode coupling between tubes 18 and 19, thus changing the magnitude of the reactance swing. That is, trimmers 50, 51 and 52 are used to adjust the modulation range to the exact multiple by adjusting degeneration at audio frequencies for the balanced modulators 18 and 19. In other words, operation of the frequency-dividing system or section 12 is accomplished simply by turning the single knob 58 which causes, simultaneously, rotary movement of switch 43 to effect a change in the tap on the "autobleeder," rotary movement of switch 49 to effect a change of division trimmer, and rotary movement of switch 53 to effect a change in zero adjustment to offset slight errors in frequency resulting from switching.

In the operation of my improved system or circuit, a modulating voltage is applied to either input, tube 18 being for capacitive reactance and tube 19 being for inductive reactance. This results in an unbalance of the modulator plate currents so that either a lagging or a leading current is impressed on the oscillator circuit or section 10. The reactive current then produces a net change in the series-resonant frequency of the crystal oscillator circuit. When radio amplifier stages follow the frequency-modulated oscillator, as in the case where the FM oscillator system herein is used for radio-frequency transmission purposes, knob 58 of section 12 is adjusted to divide the modulation by integers, thereby compensating for multiplication in such radio amplifier stages.

With regard, particularly, to the reactance tube controlled generator disclosed in the aforesaid Patent No. 2,422,422 issued to Nathaniel I. Korman, it is to be noted that in the same the respective cathode-bypass capacitors 52 and 52′ for the reactance tubes 30 and 50 are employed purely as bypass capacitors, whereas in my improved modulator the comparable capacitors 30 and 31 are employed for decoupling the cathodes 18*c* and 19*c* and for bypassing the latter for radio frequencies, the resistance means or resistive network 32, 33, 34 being employed to couple the cathodes 18*c* and 19*c* for audio frequencies. Furthermore, in the Korman generator the respective grids of the two reactance tubes 30 and 50 are driven individually and respectively from the two output windings of the transformer 40, each of these windings being functional to apply a modulating potential from cathode-to-grid of that one of the tubes 30 and 50 to which it is connected. In contrast to this operating action of the prior art; in my improved modulator only one of the two grids 18*b* and 19*b* is driven at any one time, the cathodes 18*c* and 19*c* being coupled for modulation frequencies, and the capacitors 30 and 31 being insufficient to bypass these modulation frequencies or signals. Since the output impedance of the first stage is approximately $$\frac{1}{gm}$$

for modulating frequencies, and since this stage drives a cathode circuit whose impedance also is $$\frac{1}{gm}$$

it occurs that one-half of the modulating voltage appears at the related cathode. Since the undriven grid is returned to zero modulating potential, it will be seen that each grid-cathode circuit is driven by one-half the modulating potential. For the purpose of producing variable amounts of total modulation, the amount or extent of the above-mentioned coupling of grids **18*b* and 19*b* is adjustable through switch 49 and the associated trimmer resistors 50, 51, and 52. Further, the cathode-coupling network comprised of resistors 32, 33 and 34 is returned through resistor 35** to the relatively large negative potential —E*c* which, because of the common degenerative action of the two tubes 18 and 19, provides a stabilizing influence on the total current output of the balanced stage. Thus, it will be seen that in my improved modulator the capacitor-resistor combination disclosed serves several purposes simultaneously, this operating characteristic being distinctive over the prior art, and particularly over the system disclosed in the aforesaid Korman Patent No. 2,422,422.

The values of resistance, capacitance, inductance, and voltage in Fig. 3 are not critical, and are made to suit the particular application.

It will be understood that in my improved system various modifications such as in circuit and structural arrangement, are possible and would be within the conception of those skilled in the art without departing from the spirit of my invention or the scope of the claims.

I claim as my invention:

1. In a dual-tube modulator of the character described, a first electron tube having a cathode and an anode, component and connection means in correlative relationship with respect to said tube to effect quadrature current in the anode circuit thereof in direction constituting said tube as a capacitive reactance, a second electron tube having a cathode and an anode, component and connection means in correlative relationship with respect to said second tube to effect quadrature current in the anode circuit thereof in direction constituting said second tube as an inductive reactance, capacitors by-passing said cathodes for radio frequencies, resistance means coupling said cathodes for audio frequencies and being in the form of a cathode-coupling network connected between said cathodes, a bleeder network having connection with said anodes and comprising resistors of different respective values and each effective to divide the reactance swing of said tubes by substantially an integral multiple, switch means forming part of such connection and moveable to different positions to render said last-named resistors functional selectively, trimmer resistors of different respective values and each functional when connected across said cathode-coupling network to provide a degree of decrease in the cathode coupling between said tubes thus to change the magnitude of the reactance swing, and second switch means moveable to different positions to render said trimmer resistors functional selectively.

2. In a dual-tube modulator of the character described, a first electron tube having a cathode and an anode, component and connection means in correlative relationship with respect to said tube to effect quadrature current in the anode circuit thereof in direction constituting said tube as a capacitive reactance, a second electron tube having a cathode and an anode, component and connection means in correlative relationship with respect to said second tube to effect quadrature current in the anode circuit thereof in direction constituting said second tube as an inductive reactance, capacitors by-passing said cathodes for radio frequencies, resistance means coupling said cathodes for audio frequencies and being in the form of a cathode-coupling network connected between said cathodes, a bleeder network having connection with said anodes and comprising resistors of different respective values and each effective to divide the reactance swing of said tubes by substantially an integral multiple, switch means forming part of such connection and moveable to different positions to render said last-named resistors functional selectively, trimmer resistors of different respective values and each functional when connected across said cathode-coupling network to provide a degree of decrease in the cathode coupling between said tubes thus to change the magnitude of the reactance swing, second switch means moveable to different positions to render said trimmer resistors functional selectively, capacitors of different respective values and each functional when connected with said bleeder network to effect relatively small zero shifts incidental to switching action, third switch means moveable to different positions to render said capacitors functional selectively, and means common with respect to each of said switch means aforesaid and functional to impart switching movement to all of the same simultaneously.

3. In a dual-tube modulator of the character described, terminals providing a source of input modulation signals, a first electron tube having a cathode and a grid and an anode, component and connection means in correlative relationship with respect to said tube to effect quadrature current in the anode circuit thereof in direction constituting said tube as a capacitive reactance, a cathode by-pass capacitor for said tube effective for radio frequencies and constituting a relatively high impedance for audio frequencies, a second electron tube having a cathode and a grid and an anode, component and connection means in correlative relationship with respect to said second tube to effect quadrature current in the anode circuit thereof in direction constituting said second tube as an inductive reactance, a cathode by-pass capacitor for said second tube effective for radio frequencies and constituting a relatively high impedance for audio frequencies, said capacitors decoupling said cathodes and bypassing the same for radio frequencies, said capacitors being insufficient to bypass modulation frequencies from said source whereby said cathodes are coupled for said modulating signals, said modulator being characterized by the fact that during normal operation thereof each of the two grid-cathode circuits is driven by substantially one-half the modulating potential, and means for producing variable amounts of total modulation by said modulator, said last-named means being in the form of trimmer resistors and switch means for connecting the latter selectively across said cathode-coupling network.

4. In a dual-tube modulator of the character described, terminals providing a source of input modulation signals, a first electron tube having a cathode and a grid and an anode, component and connection means in correlative relationship with respect to said tube to effect quadrature current in the anode circuit thereof in direction constituting said tube as a capacitive reactance, a cathode by-pass capacitor for said tube effective for radio frequencies and constituting a relatively high impedance for audio frequencies, a second electron tube having a cathode and a grid and an anode, component and connection means in correlative relationship with respect to said second tube to effect quadrature current in the anode circuit thereof in direction constituting said second tube as an inductive reactance, a cathode by-pass capacitor for said second tube effective for radio frequencies and constituting a relatively high impedance for audio frequencies, said capacitors decoupling said cathodes and bypassing the same for radio frequencies, said capacitors being insufficient to bypass modulation frequencies from said source whereby said cathodes are coupled for said modulating signals, said modulator being characterized by the fact that during normal operation thereof each of the two grid-cathode circuits is driven by substantially one-half the modulating potential, said cathode-coupling network being returned to a relatively large negative potential effective to provide a stabilizing influence on the total current flowing in the cathode circuitry of said tubes, and means for producing variable amounts of total modulation by said modulator, said last-named means being in the form of trimmer resistors and switch means for connecting the latter selectively across said cathode-coupling network.

References Cited in the file of this patent

UNITED STATES PATENTS

| | | |
|---|---|---|
| 2,184,104 | Smith | Dec. 19, 1939 |
| 2,349,811 | Crosby | May 30, 1944 |
| 2,422,422 | Korman | June 17, 1947 |
| 2,422,424 | Landon | June 17, 1947 |
| 2,440,622 | Usselman | Apr. 27, 1948 |
| 2,530,165 | Hugenholtz et al. | Nov. 14, 1950 |
| 2,551,809 | Mortley | May 8, 1951 |
| 2,552,157 | Delvaux | May 8, 1951 |
| 2,558,707 | Janssen et al. | June 26, 1951 |
| 2,590,753 | Clapp | Mar. 25, 1952 |
| 2,646,509 | Mortley | July 21, 1953 |
| 2,683,810 | Mortley | July 13, 1954 |
| 2,703,387 | Dutton | Mar. 1, 1955 |
| 2,777,992 | Anderson | Jan. 15, 1957 |
| 2,802,069 | Weber | Aug. 6, 1957 |